(12) United States Patent
Liu et al.

(10) Patent No.: US 10,804,298 B2
(45) Date of Patent: Oct. 13, 2020

(54) ARRAY SUBSTRATE AND DISPLAY DEVICE

(71) Applicant: BOE Technology Group Co., Ltd., Beijing (CN)

(72) Inventors: Xiaodi Liu, Beijing (CN); Guangcai Yuan, Beijing (CN); Gang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/721,109

(22) Filed: Dec. 19, 2019

(65) Prior Publication Data
US 2020/0127018 A1    Apr. 23, 2020

Related U.S. Application Data

(62) Division of application No. 15/743,597, filed as application No. PCT/CN2017/091984 on Jul. 6, 2017, now abandoned.

(30) Foreign Application Priority Data

Dec. 2, 2016 (CN) .......................... 2016 1 1095901

(51) Int. Cl.
*H01L 27/12* (2006.01)
*H01L 23/31* (2006.01)
(Continued)

(52) U.S. Cl.
CPC ........ *H01L 27/1244* (2013.01); *G02F 1/1368* (2013.01); *G02F 1/13452* (2013.01); *G02F 1/136204* (2013.01); *G02F 1/136286* (2013.01); *H01L 21/02565* (2013.01); *H01L 21/441* (2013.01); *H01L 23/291* (2013.01); *H01L 23/3171* (2013.01); *H01L 23/3192* (2013.01);
(Continued)

(58) Field of Classification Search
CPC .............. H01L 27/124; H01L 27/1248; H01L 27/3276; H01L 27/3274; G02F 1/136227; G02F 1/1345–13458
See application file for complete search history.

(56) References Cited

U.S. PATENT DOCUMENTS

| 10,224,503 B2 | 3/2019 | Kim et al. |
| 2014/0027759 A1 | 1/2014 | Ahn et al. |

(Continued)

FOREIGN PATENT DOCUMENTS

| CN | 102629588 A | 8/2012 |
| CN | 103809340 A | 5/2014 |

(Continued)

OTHER PUBLICATIONS

Oct. 11, 2017—(WO) International Search Report and Written Opinion Appn PCT/CN2017/091984 with English Tran.
(Continued)

*Primary Examiner* — Stephen M Bradley
(74) *Attorney, Agent, or Firm* — Banner & Witcoff, Ltd.

(57) ABSTRACT

An array substrate and a display device are provided. The array substrate includes a base substrate, and a first conductive layer and a second conductive layer which are sequentially disposed on the base substrate, and at least two passivation layers are continuously arranged between the first conductive layer and the second conductive layer in a direction perpendicular to the base substrate.

18 Claims, 7 Drawing Sheets

(51) Int. Cl.
*H01L 23/29* (2006.01)
*H01L 23/00* (2006.01)
*H01L 29/66* (2006.01)
*H01L 21/02* (2006.01)
*H01L 21/441* (2006.01)
*G02F 1/1345* (2006.01)
*H01L 29/786* (2006.01)
*G02F 1/1362* (2006.01)
*G02F 1/1368* (2006.01)
*H01L 27/32* (2006.01)

(52) U.S. Cl.
CPC ............ *H01L 24/32* (2013.01); *H01L 27/124* (2013.01); *H01L 27/1214* (2013.01); *H01L 27/1225* (2013.01); *H01L 27/1248* (2013.01); *H01L 27/1262* (2013.01); *H01L 27/3258* (2013.01); *H01L 29/66969* (2013.01); *H01L 29/7869* (2013.01); *G02F 2001/136295* (2013.01); *H01L 2224/32145* (2013.01); *H01L 2224/32225* (2013.01)

(56) References Cited

U.S. PATENT DOCUMENTS

2014/0132875 A1   5/2014   Yun et al.
2015/0303307 A1  10/2015   Hara et al.
2016/0380105 A1  12/2016   Wang
2018/0061855 A1   3/2018   Min et al.

FOREIGN PATENT DOCUMENTS

CN    105097548 A   11/2015
CN    106449666 A    2/2017

OTHER PUBLICATIONS

May 26, 2017—(CN) Search Report Appn 201611095901.9 with English Trans.

Jul. 4, 2017—(CN) First Office Action Appn 201611095901.9 with English Tran.

ARRAY SUBSTRATE AND DISPLAY DEVICE

The application is a divisional of U.S. patent application Ser. No. 15/743,597 filed Jan. 10, 2018, which is a U.S. National Phase Entry of International Application No. PCT/CN2017/091984 filed on Jul. 6, 2017, designating the United States of America and claiming priority to Chinese Patent Application No. 201611095901.9 filed on Dec. 2, 2016. The present application claims priority to and the benefit of the above-identified applications and the above-identified applications are incorporated by reference herein in their entirety.

TECHNICAL FIELD

Embodiments of the present disclosure relate to an array substrate and a display device.

BACKGROUND

Currently, large size oxide array substrates are in a stage of mass production and performance improvement, the mass production oxide array substrates basically comprise etching barrier layer (Etching Stop Layer, ESL) structures. Although the current technical level has achieved the mass production of the etching barrier oxide array substrates, there are many problems in the current products due to the reliability and stability problems of the oxide array substrates, such as the problems of the complexity and troublesome of compensation mode (for example, an optical compensation, an internal electrical compensation and an external electrical compensation, etc.) and life expectancy to be improved, and the performances required to be improved to adapt to harsh environments, such as military products, a high temperature, and humid environment.

SUMMARY

At least one embodiment of the present disclosure provides an array substrate and a display device, to improve the stability, reliability and dependability of the array substrate.

At least one embodiment of the present disclosure provides an array substrate, and the array substrate comprises a base substrate, a first conductive layer and a second conductive layer which are sequentially disposed on the base substrate, and at least two passivation layers are continuously arranged between the first conductive layer and the second conductive layer in a direction perpendicular to the base substrate.

According to the array substrate provided by at least one embodiment of the present disclosure, the array substrate further comprises a third conductive layer, the third conductive layer is arranged between the base substrate and the first conductive layer, and the third conductive layer is electrically insulated from the first conductive layer and the second conductive layer.

According to the array substrate provided by at least one embodiment of the present disclosure, the first conductive layer comprises a plurality of first conductive elements which are insulated from each other, the second conductive layer comprises a plurality of second conductive elements which are insulated from each other, the plurality of first conductive elements and the plurality of second conductive elements correspond to each other in one-to-one manner, and each of the second conductive elements is electrically connected with its corresponding first conductive element through a via hole penetrating through the at least two passivation layers.

According to the array substrate provided by at least one embodiment of the present disclosure, the array substrate further comprises a groove, the groove penetrates through at least one passivation layer close to the plurality of second conductive elements among the at least two passivation layers, the groove does not penetrate through a passivation layer in contact with the plurality of first conductive elements among the at least two passivation layers, and the groove comprises an interval portion, and the interval portion is located between the second conductive elements adjacent to each other in a direction parallel to the base substrate.

According to the array substrate provided by at least one embodiment of the present disclosure, the groove further comprises a connection portion, and the interval portions adjacent to each other are connected with each other by the connection portion.

According to the array substrate provided by at least one embodiment of the present disclosure, a passivation layer of the at least two passivation layers close to the second conductive layer is made of $SiN_x$.

According to the array substrate provided by at least one embodiment of the present disclosure, the at least two passivation layers comprises three passivation layers, the three passivation layers comprise a first passivation layer, a second passivation layer and a third passivation layer which are sequentially arranged on the base substrate, the first passivation layer is made of $SiO_x$, the second passivation layer is made of $SiO_xN_y$, and the third passivation layer is made of $SiN_x$.

According to the array substrate provided by at least one embodiment of the present disclosure, the array substrate comprises a display region and a peripheral region arranged on at least one side of the display region, the first conductive layer, the at least two passivation layers and the second conductive layer are arranged in the peripheral region.

According to the array substrate provided by at least one embodiment of the present disclosure, the display region further comprises a first electrode arranged in a same layer as the first conductive layer, and a second electrode arranged in a same layer as the second conductive layer, the at least two passivation layers are disposed between the first electrode and the second electrode, the first electrode comprises a source electrode and a drain electrode, and the second electrode comprises a pixel electrode or a common electrode.

According to the array substrate provided by at least one embodiment of the present disclosure, the array substrate comprises a display region and a peripheral region arranged on at least one side of the display region, the first conductive layer, the at least two passivation layers and the second conductive layer are arranged in the display region.

According to the array substrate provided by at least one embodiment of the present disclosure, a passivation layer of the at least two passivation layers close to the second conductive layer is made of $SiN_x$.

According to the array substrate provided by at least one embodiment of the present disclosure, the at least two passivation layers comprises three passivation layers, the three passivation layers comprise a first passivation layer, a second passivation layer and a third passivation layer which are sequentially arranged on the base substrate, the first passivation layer is made of $SiO_x$, the second passivation layer is made of $SiO_xN_y$, and the third passivation layer is made of $SiN_x$.

At least one embodiment of the present disclosure further provides a display device, and the display device comprises any one of the array substrate described above.

According to the display device provided by at least one embodiment of the present disclosure, further comprises a circuit board, in which the circuit board is provided with a connection electrode layer, the connection electrode layer comprises a plurality of connection electrodes insulated from each other, the plurality of connection electrodes and the plurality of second conductive elements correspond to each other in one-to-one manner, and the connection electrodes are respectively connected with the second conductive elements through an anisotropic conductive adhesive.

According to the display device provided by at least one embodiment of the present disclosure, a portion of the anisotropic conductive adhesive provided in a groove has a crack.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

REFERENCE NUMERALS

01—display region; 02—peripheral region; 021—bonding region; 101—base substrate; 106—first conductive layer; 110—second conductive layer; 107—first passivation layer; 108—second passivation layer; 109—third passivation layer; 102—third conductive layer; 1060—first conductive element; 1101—second conductive element; 115—groove; 1151—interval portion of the groove; 1152—connection portion of the groove; 201—circuit board; 202—connection electrode layer; 2020—connection electrode; 0301—crack; 10—array substrate; 20—opposite substrate.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The terms "on," "under," "right," "left" and the like are only used to indicate relative position relationship, and when the position of the object which is described is changed, the relative position relationship may be changed accordingly.

Figure 1:
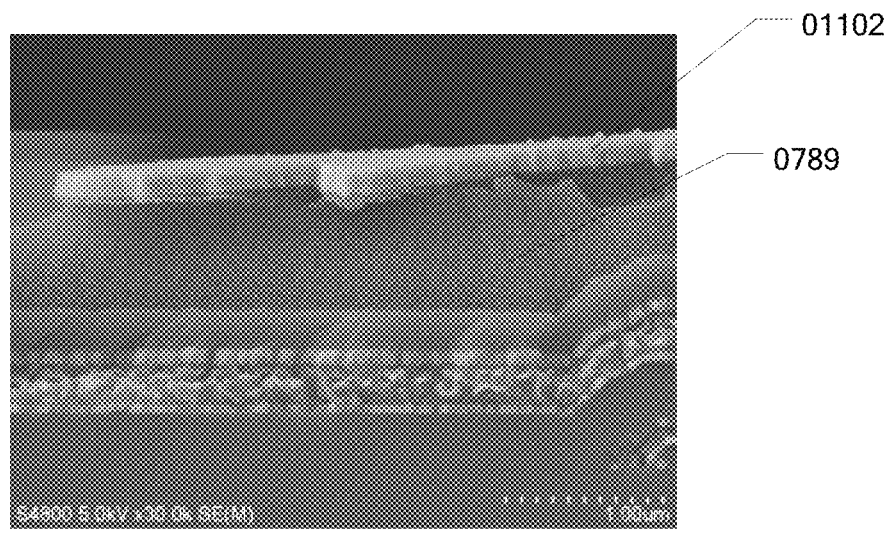
FIG. 1 is a scanning electron microscope (SEM) photo of poor contact of ITO and resin.
Figure 2:
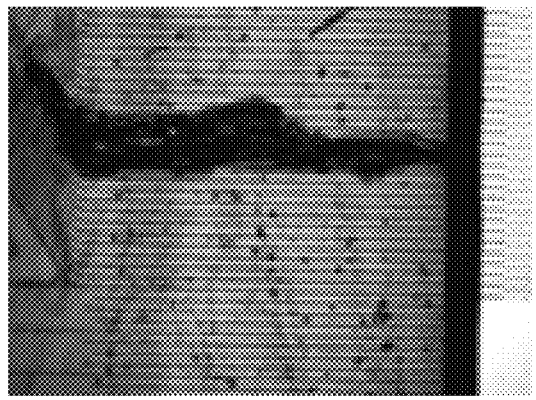
FIG. 2 is a schematic diagram of breakdown in a bonding region.

In general, an array substrate comprises a display region and a peripheral region arranged on at least one side of the display region. In the display region, a pixel electrode formed of indium tin oxide (ITO) is electrically connected with a drain electrode of a thin film transistor through a via hole of a resin layer, and the pixel electrode is arranged on the resin layer and in contact with the resin layer. But an adhesion between the ITO pixel electrode and the resin layer is not good, which easily causes a problem of bad contact between the ITO pixel electrode and the resin layer, as illustrated in FIG. 1, the adhesion between the ITO layer 01102 and the resin layer 0789 is not good. In the peripheral region, on one hand, in a connection region (i.e. a bonding region) between the array substrate and a driving IC, it also has a similar problem of bad adhesion between the ITO layer 01102 and the resin layer 0789, so that an electrical breakage is easy to occur. On the other hand, connection electrodes of a flexible chip on film (COF) (IC driver) are electrically connected with wirings in the bonding region of the array substrate by an anisotropic conductive film adhesive (ACF adhesive), and the ACF adhesive between two adjacent wirings is needed to be in a state of electric disconnection; however, because a distance between the adjacent wirings is very small, a short circuit is easy to occur so that a breakdown is caused. As illustrated in FIG. 2, a breakdown region in the bonding region is illustrated. In general, the life of the array substrate is short, the adhesion of the passivation layer and the electrode layer is not good, the phenomena of the short circuit and the open circuit in the bonding region are easy to occur.

At least one embodiment of the present disclosure provides an array substrate, and the array substrate comprises a base substrate, and a first conductive layer and a second conductive layer which are sequentially disposed on the base substrate, at least two passivation layers are arranged continuously between the first conductive layer and the second conductive layer in a direction perpendicular to the base substrate (the at least two passivation layers are continuously formed in the direction perpendicular to the base substrate).

The array substrate has at least one of the beneficial effects as follows.

(1) the passivation layers are formed continuously, which is convenient for adjusting the composition of the passivation layers, so that there is a good adhesion between the second conductive layer and the passivation layer contacting with the second conductive layer, and the connection performance between the second conductive layer and the passivation layer contacting with the second conductive layer is more stable.

(2) the passivation layer are formed continuously, which is convenient for forming a groove in the passivation layer to increase a height difference of a non electrical connection region of an ACF adhesive, so that the anisotropic conductive adhesive in the groove is deformed or broken, thereby the anisotropic conductivity of the anisotropic conductive adhesive is improved, and the short circuit problem and/or the open circuit problem of the display screen are reduced.

Thus, the stability, reliability and dependability of the array substrate are improved. Accordingly, the service life of the array substrate is prolonged and the application field of the array substrate is widened. For example, it is possible to improve the life and application range of the array substrate in harsh conditions, such as a high temperature environment and a high humidity environment.

First Embodiment

Figure 3:
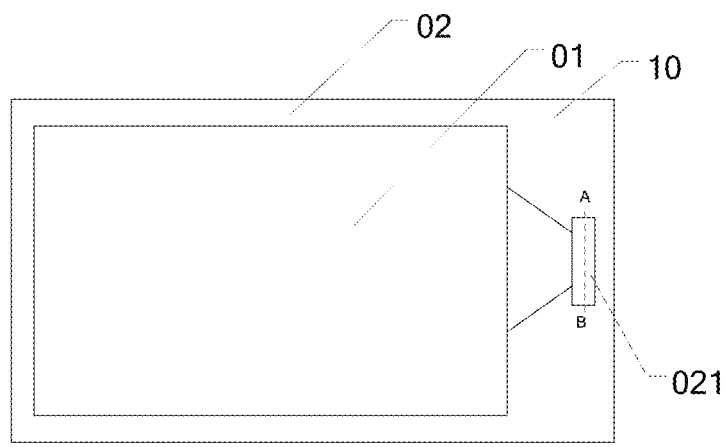
FIG. 3 is a top view of an array substrate provided by an embodiment of the present disclosure.

The present embodiment provides an array substrate 10, as illustrated in FIG. 3, the array substrate comprises a display region 01 and a peripheral region 02 arranged on at least one side of the display region 01. In FIG. 3, a bonding region 021 in the peripheral region 02 is also illustrated. For example, the bonding region 021 is configured to connect an external circuit. For example, the bonding region 021 is configured to connect a driving IC. For example, the bonding region 021 is used as a leading out region of a flexible circuit board.

Figure 4:
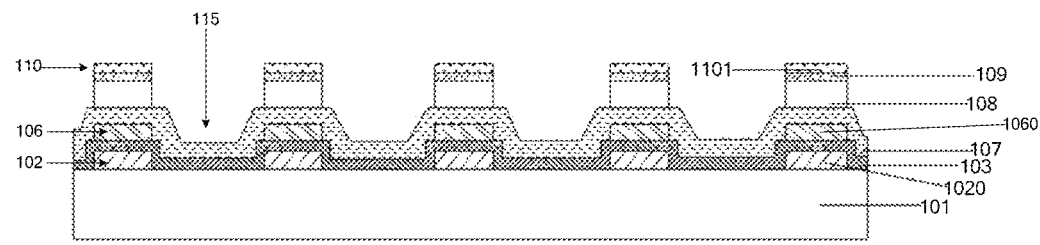
FIG. 4 is a schematic sectional view taken along a line A-B in FIG. 3.

As illustrated in FIG. 4, the array substrate comprises a base substrate 101, a first conductive layer 106 and a second conductive layer 110 which are sequentially disposed on the base substrate 101, at least two passivation layers are continuously arranged between the first conductive layer 106 and the second conductive layer 110 in a direction perpendicular to the base substrate 101. The first conductive layer 106, the at least two passivation layers and the second conductive layer 110 are arranged in the peripheral region 02. FIG. 4 takes a structure that three passivation layers are continuously arranged between the first conductive layer 106 and the second conductive layer 110 in the direction perpendicular to the base substrate 101 as an example, the three passivation layers comprise a first passivation layer 107, a second passivation layer 108 and a third passivation layer 109 which are sequentially arranged on the base substrate 101.

The array substrate 10 provided by the present embodiment has at least the beneficial effects as follows: the passivation layers are formed continuously, which is convenient for adjusting the composition of the passivation layers, so that there is a good adhesion between the second conductive layer and the passivation layer contacting with the second conductive layer, and the connection performance between the second conductive layer and the passivation layers is more stable.

For example, as illustrated in FIG. 4, the first conductive layer 106 comprises a plurality of first conductive elements 1060 which are insulated from each other, the second conductive layer 110 comprises a plurality of second conductive elements 1101 which are insulated from each other, the plurality of first conductive elements 1060 and the plurality of second conductive elements 1101 correspond to each other in a one-to-one manner, and each of the second conductive elements 1101 is electrically connected with its corresponding first conductive element 1060 (not illustrated in FIG. 4, referring to the peripheral region 02 in FIG. 6f and/or FIG. 9) through a via hole 789 (not illustrated in FIG. 4, referring to FIG. 5a, FIG. 5b, FIG. 6f and/or FIG. 9) penetrating through the at least two passivation layers.

In one example, as illustrated in FIG. 4, the array substrate further comprises a third conductive layer 102, and the third conductive layer 102 is arranged between the base substrate 101 and the first conductive layer 106, the third conductive layer 102 is electrically insulated from the first conductive layer 106, and the third conductive layer 102 is electrically insulated from the second conductive layer 110.

The array substrate 10 provided by the present disclosure has at least the beneficial effects as follows: the passivation layer are formed continuously, which is convenient for forming a groove in the passivation layer to increase a height difference of a non electrical connection region of an ACF adhesive, so that the anisotropic conductive adhesive in the groove is deformed or broken, thereby the anisotropic conductivity of the anisotropic conductive adhesive is improved, and the short circuit problem and/or an open circuit problem of the display screen are reduced.

Figure 5A:
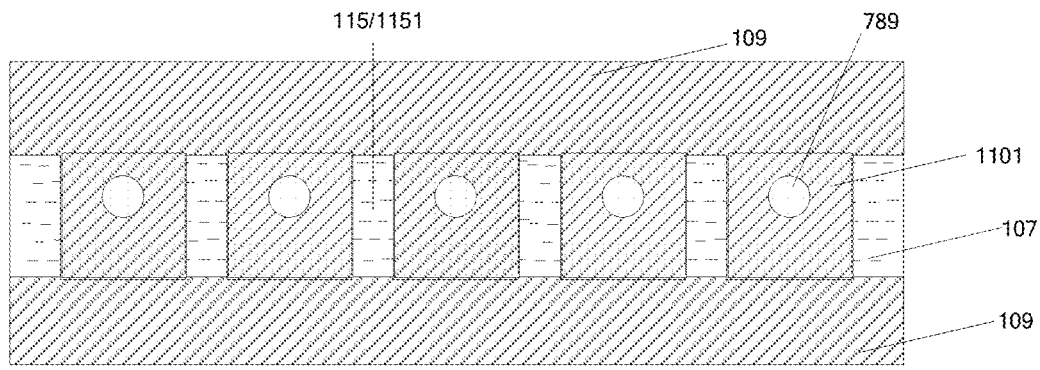
FIG. 5a is a top view of a bonding region of FIG. 3 provided by an embodiment of the present disclosure.

In one example, as illustrated in FIG. 4 and FIG. 5a, the array substrate further comprises a groove 115, the groove 115 penetrates through at least one passivation layer close to the plurality of second conductive elements 1101 among the at least two passivation layers, and the groove 115 does not penetrate through a passivation layer in contact with the plurality of first conductive elements 1060 among the at least two passivation layers, and the groove 115 at least comprises an interval portion 1151, and the interval portion 1151 is located between the second conductive elements 1101 adjacent to each other in a direction parallel to the base substrate 101. FIG. 5a takes the structure that the groove 115 comprises the interval portion 1151 as an example, the arrangement of the groove 115 increases the height difference of the non electrical connection region of the ACF adhesive, so that the anisotropic conductive adhesive in the groove is broken, thereby the anisotropic conductivity of the anisotropic conductive adhesive is improved, and the short circuit problem and/or an open circuit problem of the display screen are reduced. Thus, the stability, reliability and dependability of the array substrate are improved. The service life of the array substrate is prolonged and the application field of the array substrate is widened.

Figure 5B:
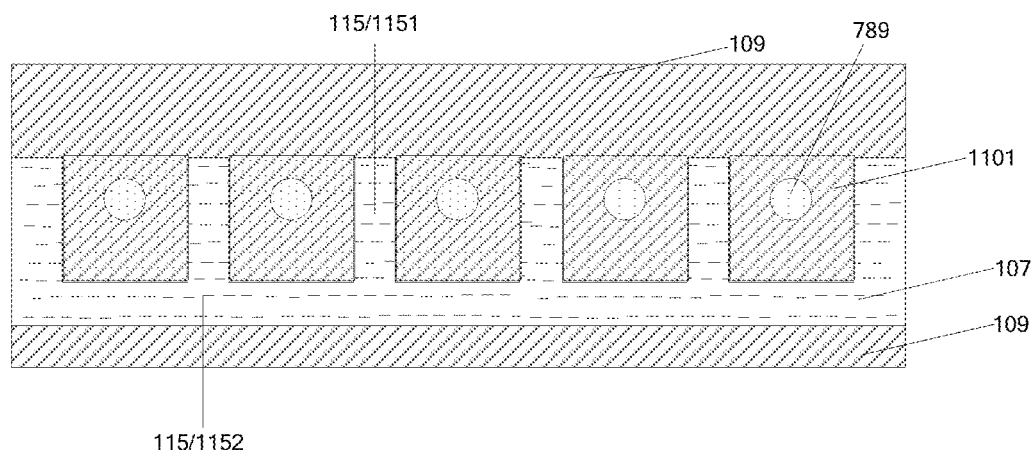
FIG. 5b is a another top view of the bonding region of FIG. 3 provided by an embodiment of the present disclosure.

In one example, as illustrated in FIG. 4 and FIG. 5b, the groove 115 at least further comprises a connection portion 1152, and the interval portions adjacent to each other 1151 are connected with each other by the connection portion 1152. The arrangement of the connection portion 1152 makes the ACF adhesive has the height differences in more groove regions, so that the anisotropic conductive adhesive in the grooves is deformed or broken, and the two adjacent second conductive elements are better insulated from each other (not electrically connected with each other) to avoid the short circuit problem.

In one example, a passivation layer of the at least two passivation layers close to the second conductive layer 110 is made of $SiN_x$. $SiN_x$ has a good adhesion and the adhesion of passivation layer to second conductive layer 110 is increased, therefore, the connection performance of the conductive material and the passivation layer is improved, and the stability, reliability and dependability of the array substrate are improved.

In one example, the first passivation layer 107 is made of $SiO_x$, the second passivation layer 108 is made of $SiO_xN_y$, and the third passivation layer is made of $SiN_x$. By adjusting the composition of the passivation layers, a good adhesion between the second conductive layer and the passivation layer contacting with the second conductive layer is obtained, which makes the connection performance between the layers more stable.

The above takes a structure that the first conductive layer 106, the at least two passivation layers and the second conductive layer 110 are arranged in the peripheral region 02 as an example; however, the present embodiment is not limited thereto.

Figure 6A:
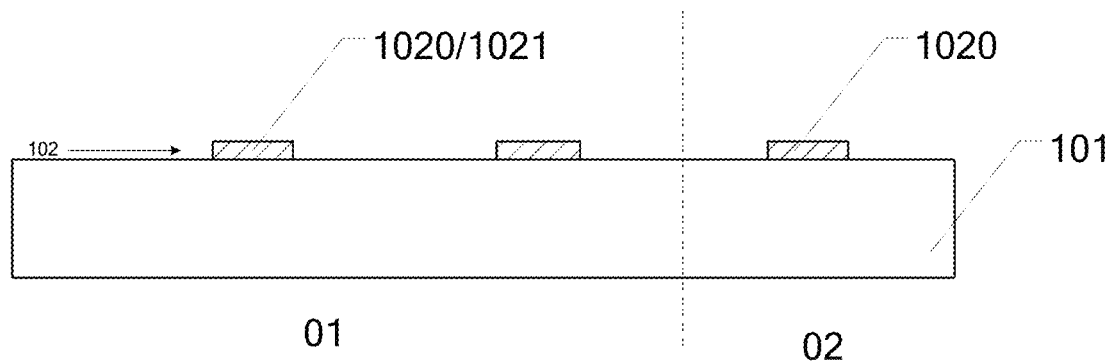
FIG. 6a is a schematic sectional view after a third conductive layer is formed on a base substrate provided by an embodiment of the present disclosure.
Figure 6B:
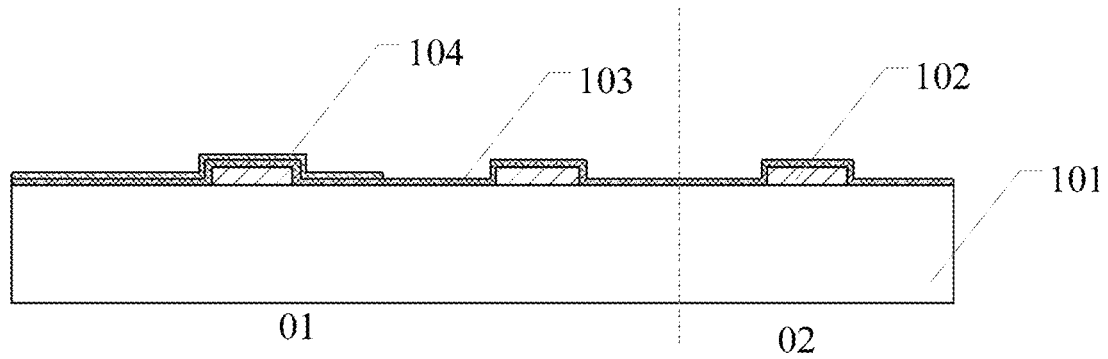
FIG. 6b is a schematic sectional view after a gate insulating layer and an active layer are formed on the third conductive layer provided by an embodiment of the present disclosure.
Figure 6C:
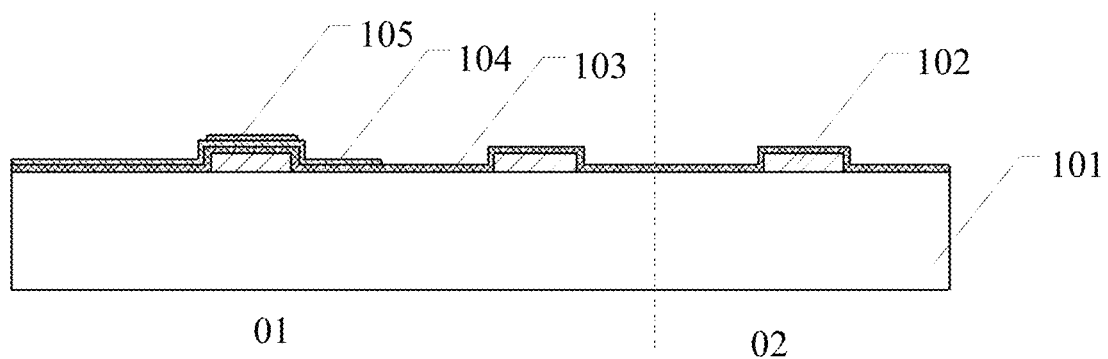
FIG. 6c is a schematic sectional view after an etching barrier layer is formed on the active layer provided by an embodiment of the present disclosure.
Figure 6D:
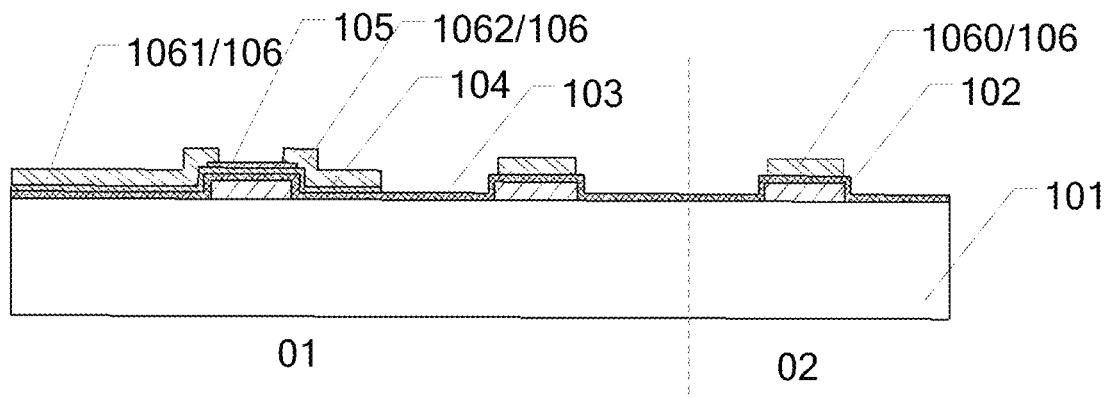
FIG. 6d is a schematic sectional view after a first conductive layer is formed on an etching barrier layer provided by an embodiment of the present disclosure.
Figure 6E:
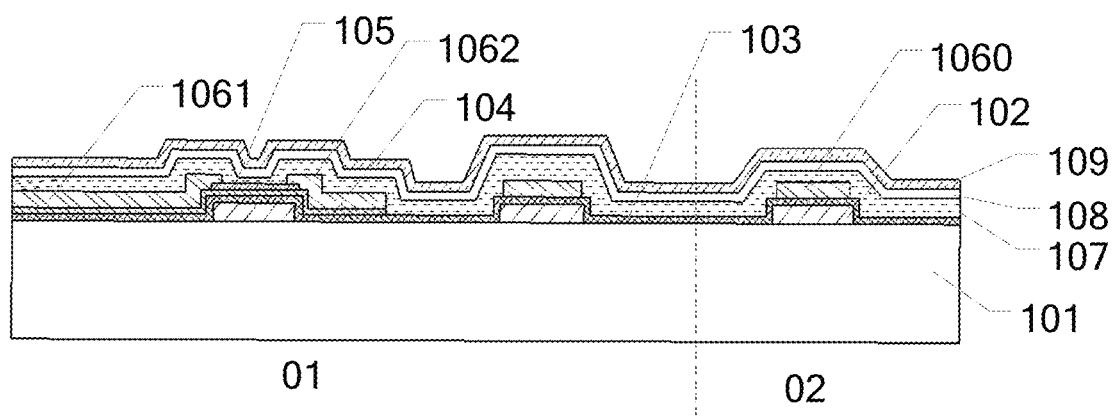
FIG. 6e is a schematic sectional view after at least two passivation layers are continuously formed in a direction perpendicular to the base substrate on the first conductive layer provided by an embodiment of the present disclosure.
Figure 6F:
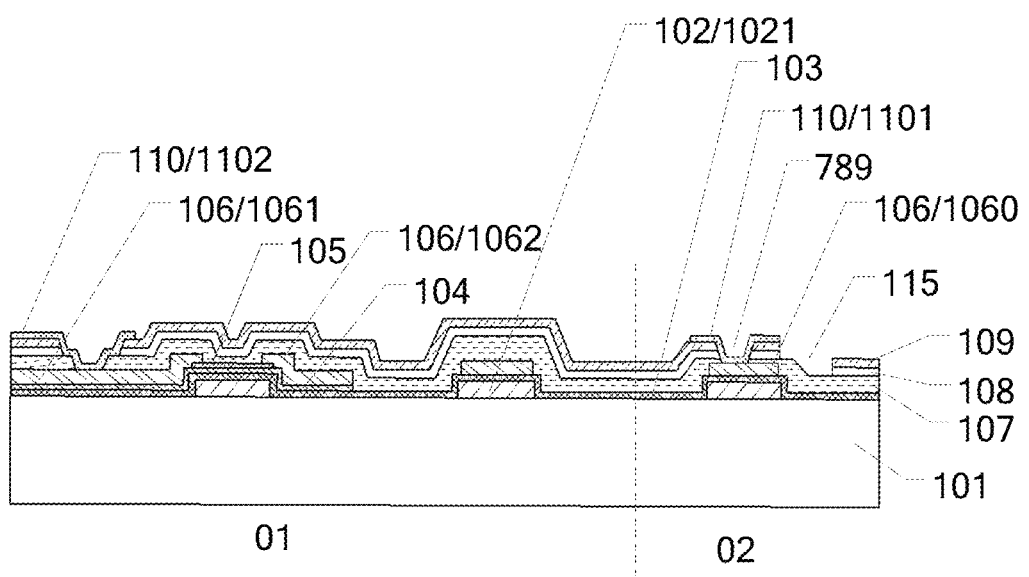
FIG. 6f is a schematic sectional view after a second conductive layer is formed on the at least two passivation layers continuously formed in the direction perpendicular to the base substrate provided by an embodiment of the present disclosure.

For example, as illustrated in FIG. 6f, the display region 01 further comprises a first electrode arranged in a same layer as the first conductive layer 106, and a second electrode 1102 arranged in a same layer as the second conductive layer 110, the at least two passivation layers are disposed between the first electrode and the second electrode, the first electrode comprises a source electrode 1062 and a drain electrode 1061, and the second electrode is a pixel electrode 1102 or a common electrode. The pixel electrode 1102 is electrically connected to the drain electrode 1061 by penetrating through the at least two passivation layers between the first conductive layer 106 and the second conductive layer 110. For example, three passivation layers are disposed between the first electrode and the second electrode: the first passivation layer 107, the second passivation layer 108 and the third passivation layer 109. For example, the display region 01 further comprises a gate electrode 1021 arranged in a same layer as the third conductive layer 102.

Figure 9:
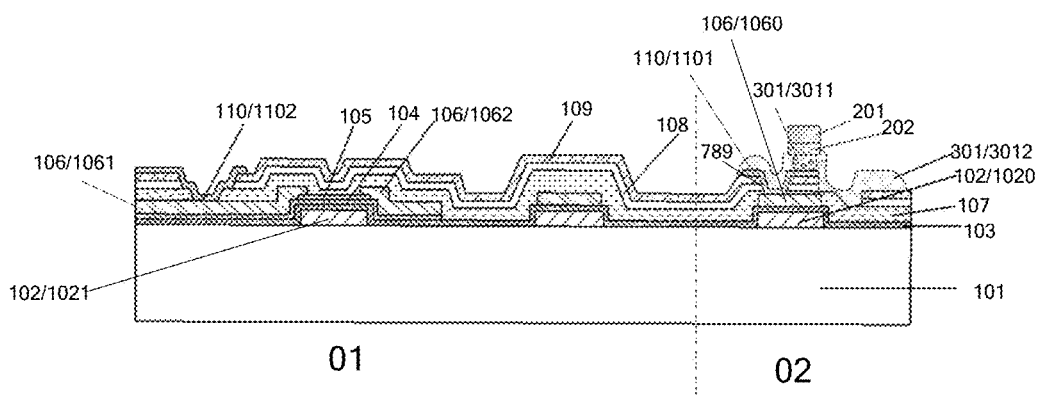
FIG. 9 is a cross sectional of the bonding region of the display device (comprising a display region and a peripheral region) provided by an embodiment of the present disclosure.

In one example, as illustrated in FIG. 6f, the third conductive layer 102 is a gate electrode layer, the gate electrode layer in the display region comprises the gate electrode 1021, and a third conductive element 1020 in the peripheral region is formed in a same layer as the gate electrode 1021. A gate insulating layer 103 is formed on the third conductive layer 102. FIG. 9 further illustrates an active layer 104 and an etching barrier layer 105 disposed on the active layer 104.

The number of the at least two passivation layers disposed between the first conductive layer 106 and the second conductive layer 110 is not limited in the present embodiment.

Taking the manufacturing method of the array substrate as illustrated in FIG. 6f as an example, the present embodiment further provides a manufacturing method of an array substrate, and the manufacturing method of the array substrate comprises the following steps.

Step 1: forming the third conductive layer 102 on the base substrate. For example, forming the third conductive layer 102 on the base substrate comprises: depositing a metal layer on the base substrate made of glass, plastic (polyimide), silicon or other base substrates by a sputtering method, in which the metal layer is formed of Mo, $Al/N_d$, $Al/N_d/Mo$, $Mo/Al/N_d/Mo$, Au/Ti, Pt/Ti and other metals or alloys; patterning the metal layer by photolithography to obtain the third conductive layer 102, in which the third conductive layer 102 comprises the gate electrode 1021 (the third conductive element) in the display region 01 and the third conductive element 1020 in the peripheral region 02, as illustrated in FIG. 6a.

Step 2: forming the gate insulating layer 103 and the active layer 104, as illustrated in FIG. 6b. For example, the gate insulating layer 103 is prepared by an atmospheric pressure chemical vapor deposition method, a low-pressure chemical vapor deposition method, a plasma assisted chemical vapor deposition method, a sputtering method or other preparation methods. Any one of the above methods is adopted to deposit a single-layer or a multi-layer gate insulating layer which is made of $SiO_x$, $SiN_x$, SiON, $Al_2O_3$, $HfO_2$, $ZrO_2$, $TiO_2$, $Y_2O_3$, $La_2O_3$, $Ta_2O_5$ etc. For example, the active layer 104 is prepared by a sputtering method, a sol-gel method, a vacuum evaporation method, a spraying method, an ink-jet printing method or other methods, the active layer is made of indium gallium zinc (IGZO), nitrogen Zinc Oxide (ZnON), indium tin zinc (ITZO), Zinc Oxide tin (ZTO), Zinc Oxide indium (ZIO), indium gallium oxide (IGO), alumina zinc tin (AZTO) and so on.

Step 3: forming the etching barrier layer 105, as illustrated in FIG. 6c. For example, the etching barrier layer 105 is prepared by an atomic layer deposition method, an atmospheric pressure chemical vapor deposition method, a low pressure chemical vapor deposition method, a plasma assisted chemical vapor deposition method, a sputtering method, a sol-gel method and so on. Any one of the above methods is adopted to deposit a single-layer or a multi-layer film which is made of $SiO_x$, $SiN_x$, SiON, $Al_2O_3$, TEOS etc., and the film is patterned to obtain the etching barrier layer 105.

Step 4: forming the first conductive layer 106, as illustrated in FIG. 6d. For example, depositing a metal or an alloy film of Mo, AlNd, AlNd/Mo, Mo/AlNd/Mo, Au/Ti, Pt/Ti and so on by a sputtering method, and patterning the film by photolithography to obtain the first conductive layer 106. The first conductive layer 106 comprises the first conductive element 1060 in the peripheral region 02, the source electrode 1062 and the drain electrode 1061.

Step 5: continuously forming at least two passivation layers in the direction perpendicular to the base substrate, as illustrated in FIG. 6e. For example, the passivation layers are prepared by a thermal growth method, an atmospheric pressure chemical vapor deposition method, a low pressure chemical vapor deposition method, a plasma assisted chemical vapor deposition method, a sputtering method, a spin coating method and other preparation methods. Any one of the above methods is adopted to prepare the passivation layers made from one or more of $SiO_x$, $SiN_x$, $SiO_xN_y$, $Al_2O_3$ and resin etc., or different components of the above mentioned materials.

Step 6: forming contact holes and/or the grooves and forming the second conductive layer, as illustrated in FIG. 6f. For example, this step comprises: patterning the passivation layer to form the contact holes and/or the grooves; sputtering the transparent conductive material, for example, depositing a ITO film on the passivation layer; and patterning the ITO film to form the second conductive layer. The material of the second conductive layer is not limited to ITO.

Step 7: annealing. For example, the above products are annealed in vacuum, nitrogen, air or oxygen environment, the annealing temperature is in a range from 120 to 450° C., and the annealing time is in a range from 0.5 hours to 3 hours.

Second Embodiment

It is different from the first embodiment, the first conductive layer 106, the at least two passivation layers and the second conductive layer 110 are only arranged in the display region 01 in the second embodiment. With reference to the display region 01 at the left side of FIG. 6f. The first conductive layer 106 comprises a plurality of first conductive elements 1060 which are insulated from each other, the first conductive elements 1060 are source electrodes 1062 or drain electrodes 1061. The second conductive layer 110 comprises a plurality of second conductive elements 1102 which are insulated from each other, and the second conductive elements 1102 are pixel electrodes. Each of the second conductive elements 1102 is electrically connected with its corresponding first conductive element 1060 (for example, the drain electrodes 1061) through a via hole penetrating through the at least two passivation layers.

In one example, the second conductive elements 1102 are common electrodes. In a case that the second conductive elements 1102 are the common electrodes, the second conductive elements 1102 are electrically insulated from the first conductive elements 1060.

In one example, as illustrated in FIG. 6f, a passivation layer of the at least two passivation layers close to the second conductive layer 110 is made of $SiN_x$. $SiN_x$ has a good adhesion and the adhesion of passivation layer to second conductive layer 110 is increased, therefore, the connection performance of the conductive material and the passivation layer is improved, and the stability, reliability and dependability of the array substrate are improved. For example, three passivation layers are disposed between the first electrode layer 106 and the second electrode layer 110, the passivation layer close to the second electrode layer 110 is a third passivation layer 109.

In one example, as illustrated in FIG. 6f, the three passivation layers comprise a first passivation layer 107, a second passivation layer 108 and the third passivation layer 109 which are sequentially arranged on the base substrate 101, the first passivation layer 107 is made of $SiO_x$, the second passivation layer 108 is made of $SiO_xN_y$, and the third passivation layer 109 is made of $SiN_x$. By adjusting the composition of the passivation layers, a good adhesion between the second conductive layer and the passivation layer contacting with the second conductive layer is obtained, which makes the connection performance between the layers more stable.

Third Embodiment

The present embodiment provides a display device, and the display device comprises any one of the array substrates described in the first embodiment and the second embodiment.

For example, the display device comprises a liquid crystal display device or an organic light emitting diode display device, which is not limited herein.

For example, the display device comprises: a television, a digital camera, a mobile phone, a watch, a tablet computer, a notebook computer, a navigation system etc.

The following takes the case that the display device is the liquid crystal display device as an example. In a case that the display device is the liquid crystal display device, the modes such as an advanced super dimension switching (ADS) mode, a high aperture advanced super dimensional switching (HADS) mode, a twisted nematic (TN) mode, a vertical alignment (VA) mode and other models may be adopted by the liquid crystal display device, which will not be limited in the present embodiment.

Figure 7:
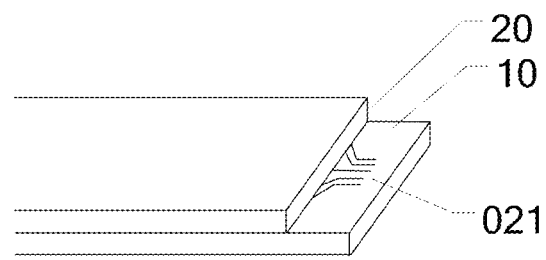
FIG. 7 is a schematic diagram of a display device (before bonding) provided by an embodiment of the present disclosure.
Figure 8A:
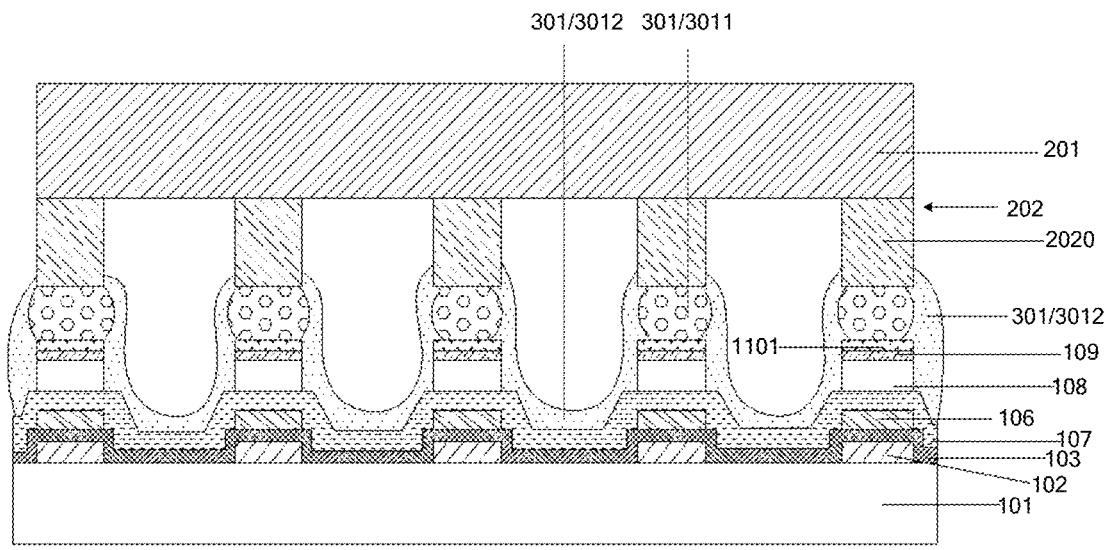
FIG. 8a is a cross sectional of a bonding region of a display device provided by an embodiment of the present disclosure.

In one example, as illustrated in FIG. 7, the array substrate 10 and an opposite substrate 20 are assembled with each other, and a liquid crystal layer is formed between the array substrate 10 and the opposite substrate 20 (the liquid crystal layer is not illustrated in the FIG. 7), and the bonding region 021 is exposed. For example, as illustrated in FIG. 8a, the display device further comprises a circuit board 201, the circuit board 201 is provided with a connection electrode layer 202, the connection electrode layer 202 comprises a plurality of connection electrodes 2020 insulated from each other, the plurality of connection electrodes 2020 and the plurality of second conductive elements 1101 correspond to each other in a one-to-one manner, and the connection electrodes 2020 are respectively connected with the second conductive elements 1101 through an anisotropic conductive adhesive 301. For example, the circuit board 201 is a flexible circuit board, a chip is disposed on the flexible circuit board, that is, the COF is formed, which is not limited herein.

For example, as illustrated in FIG. 8a, a portion of the anisotropic conductive adhesive 301 located between the connection electrode 2020 and the second conductive element 1101 corresponding to the connection electrode 2020 is an electrical connection region 3011. A portion of the anisotropic conductive adhesive 301 located between the adjacent connection electrodes 2020 is a non electrical connection region 3012. For example, there are many conductive particles in the anisotropic conductive adhesive 301, and each of the conductive particles is covered by an insulating layer, so that after a hot pressing process, the electric connection region 3011 and the non electric connection region 3012 are formed. The anisotropic conductive adhesive 301 in the electrical connection region 3011 is conductive in its thickness direction and is not conductive in a direction parallel to its surface.

Figure 8B:
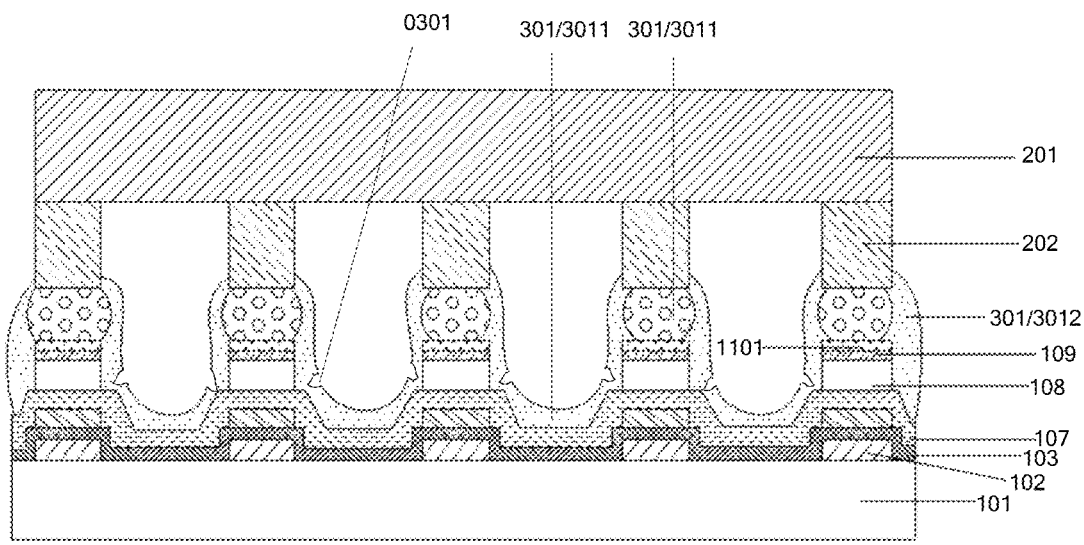
FIG. 8b is a cross sectional of the bonding region (ACF adhesives have cracks) of the display device provided by an embodiment of the present disclosure.

At least two passivation layers are continuously arranged between the first conductive layer 106 and the second conductive layer 110 in the direction perpendicular to the base substrate 101. Therefore, the height difference of the non electrical connection region between the second conductive layer 110 and the COF is improved. The arrangement of the groove 115 makes that a larger slope angle is disposed in the position where no electrical connection is required. Therefore, as illustrated in FIG. 8b, the portion of the anisotropic conductive adhesive 301 in the groove 115 is broken to increase the resistance of the non electrical connection region. That is, the portion of the anisotropic conductive adhesive 301 provided in the groove has a crack 0301. For example, as illustrated in FIG. 8b, the crack 0301 is formed at an edge of the groove. For example, the crack 0301 is formed at a position of climbing slope of the groove 115 (i.e. the crack 0301 is formed at a position that the first passivation layer 107 is close to the second passivation layer 108 in the groove), which is not limited herein. For example, the crack 0301 is formed in the groove 115 at a position that the second passivation layer 108 and third passivation layer 109 are located. For example, the anisotropic conductivity of anisotropic conductive adhesive in the non electrical connection region 3012 is improved by using thermoplastic (for example, a hot pressing temperature is within 230 degrees) ACF adhesive having an appropriate ductility which is deformed or fractured at the groove (at the step), then the electrical connection of the COF is improved, and a short circuit problem and an open circuit problem of a display screen are reduced. The array substrate is manufactured without increasing a new mask, which is beneficial to control the cost.

FIG. 9 illustrates a schematic diagram of a display device adopting the display substrate as illustrated in FIG. 6f.

The embodiment of the present disclosure takes the case that the COF is electrically connected with the wire in the bonding region as an example, but the driving IC is not limited to the COF, other forms are also suitable, no limitation will be given here in the embodiment of the present disclosure.

It should be understood that, in the embodiments of the present disclosure, the "same layer" refers to forming a film layer configured to form a predetermined pattern by the same film forming process, and forming a layer structure with the same mask by one patterning process. According to differences of the predetermined pattern, the one patterning process may include multiple exposure, development, or etching process, and the predetermined pattern in the layer structure may be continuous or may be discontinuous, the predetermined pattern may also be in different heights or have different thicknesses.

In the embodiments of present disclosure, a patterning to form a pattern or a patterning process may only include a photolithography process, or include a photolithography process and an etching process, or include other processes to form a preset pattern such as a printing process, and an inkjet process. A photolithography process includes forming a pattern by processes such as film forming, exposure, and development etc., by using photoresist, mask, exposure machine etc. The corresponding patterning process may be selected according to the structure formed in the embodiment of the present disclosure.

The following points need to be explained:
(1) Unless otherwise defined, in the embodiments of the present disclosure and the drawings of the present disclosure, a same reference numeral represents a same meaning.
(2) The drawings of the embodiments of the present disclosure are only related to the structures related to the embodiments of the present disclosure, and other structures can refer to general designs.
(3) For clarity, in the drawings for describing the embodiments of the present disclosure, a thickness of a layer or a thickness of a region is exaggerated or reduced, that is, these drawings are not drawn according to an actual scale. It should be understood that: in a case that an element such as a layer, a film, a region or a substrate is referred to as being disposed "on" or "beneath" another element, the element may be "directly" disposed "on" or "beneath" another element, or an intermediate element may be provided.
(4) In the absence of conflict, the embodiments of the present disclosure and the features in the embodiments can be combined with each other to obtain new embodiments.

What are described above is related to the illustrative embodiments of the disclosure only and not limitative to the scope of the disclosure. Any changes or replacements easy for those skilled familiar with the technology field to envisage in the technical scope disclosed in the present disclosure should be covered within the protection scope of the present disclosure. Therefore, the scopes of the disclosure are defined by the accompanying claims.

What is claimed is:

1. A display device, comprising
an array substrate, comprising:
a base substrate,
a first conductive layer and a second conductive layer, sequentially disposed on the base substrate, wherein the second conductive layer comprises a plurality of second conductive elements which are insulated from each other;
at least two passivation layers, continuously arranged between the first conductive layer and the second conductive layer in a direction perpendicular to the base substrate, and
at least one first groove, wherein the least one first groove penetrates through at least one passivation layer close to the second conductive layer among the at least two passivation layers, the at least one first groove does not penetrate through a passivation layer in contact with the first conductive layer among the at least two passivation layers, and each of the least one first groove is between adjacent second conductive elements adjacent;
a circuit board, comprising:
a connection electrode layer, comprising a plurality of connection electrodes insulated from each other, the plurality of connection electrodes and the plurality of second conductive elements corresponding to each other in one-to-one manner, and
an anisotropic conductive adhesive, connecting the connection electrodes with the second conductive elements, to electrically connect each of the connection electrodes with its corresponding conductive element in the direction perpendicular to the base substrate,
wherein the array substrate comprises a display region and a peripheral region arranged on at least one side of the display region, and the first conductive layer, the at least two passivation layers, and the second conductive layer are in the peripheral region; and
a portion of the anisotropic conductive adhesive is provided in the at least one first groove, and the portion of the anisotropic conductive adhesive has a crack.

2. The display device according to claim 1, wherein the portion of the anisotropic conductive adhesive having the crack is on a side wall of the at least one first groove.

3. The display device according to claim 1, wherein in the direction perpendicular to the base substrate, the crack is at a side of the second conductive layer close to the base substrate.

4. The display device according to claim 1, wherein in the direction perpendicular to the base substrate, the second conductive layer is not overlapped with the at least one first groove.

5. The display device according to claim 1, wherein the array substrate further comprises a third conductive layer, wherein the third conductive layer is between the base substrate and the first conductive layer, and the third conductive layer is electrically insulated from the first conductive layer and the second conductive layer.

6. The display device according to claim 5, further comprising a thin film transistor in the display region,
wherein a gate electrode of the thin film transistor is in a same layer and made of a same material as the third conductive layer, and a source electrode and a drain electrode of the thin film transistor is in a same layer and made of a same material as the first conductive layer.

7. The display device according to claim 6, further comprising a pixel electrode in the display region,
wherein the pixel electrode is electrically connected with the source electrode or the drain electrode of the thin film transistor,
and the pixel electrode is in a same layer and made of a same material as the second conductive layer.

8. The display device according to claim 6, further comprising a common electrode in the display region, wherein the common electrode is in a same layer and made of a same material as the second conductive layer.

9. The display device according to claim 1, wherein the first conductive layer comprises a plurality of first conductive elements which are insulated from each other, the plurality of first conductive elements and the plurality of second conductive elements correspond to each other in a one-to-one manner, and each of the second conductive elements is electrically connected with its corresponding first conductive element through a via hole penetrating through the at least two passivation layers.

10. The display device according to claim 9, wherein in the direction perpendicular to the base substrate, the via hole is not overlapped with the at least one first groove.

11. The display device according to claim 1, wherein the array substrate further comprises a second groove extended along an arrangement direction of the plurality of second conductive elements, and each of the at least one first groove is connected with the second groove.

12. The display device according to claim 10, wherein in the direction perpendicular to the base substrate, the second conductive layer is not overlapped with the at least one first groove as well as the second groove.

13. The display device according to claim 1, wherein the at least two passivation layers comprises three passivation layers, the three passivation layers comprise a first passivation layer, a second passivation layer, and a third passivation layer which are sequentially arranged on the base substrate;
the at least one first groove penetrates through the second passivation layer and the third passivation layer, and the at least one first groove does not penetrate through the first passivation layer.

14. The display device according to claim 13, wherein the portion of the anisotropic conductive adhesive having the crack is on a side wall of the second passivation layer.

15. The display device according to claim 13, in the direction perpendicular to the base substrate, the crack is at a side of the third passivation layer close to the base substrate.

16. The display device according to claim 13, wherein the crack is nearest to the first passivation layer among the three passivation layers.

17. The display device according to claim 13, wherein the first passivation layer is made of SiOx, the second passivation layer is made of SiOxNy, and the third passivation layer is made of SiNx.

18. The display device according to claim 1, wherein the circuit board is a flexible circuit board.

* * * * *